United States Patent [19]
Shiraishi et al.

[11] Patent Number: 5,660,629
[45] Date of Patent: Aug. 26, 1997

[54] APPARATUS FOR DETECTING THE DIAMETER OF A SINGLE-CRYSTAL SILICON

[75] Inventors: Yutaka Shiraishi, Hiratsuka, Japan; Yihao Chang, Kanata, Canada

[73] Assignee: Kamatsu Electronic Metals Co., Ltd., Hiratsuka, Japan

[21] Appl. No.: 649,266

[22] Filed: May 17, 1996

[30] Foreign Application Priority Data

Nov. 11, 1994 [JP] Japan ..................... 6-301714

[51] Int. Cl.$^6$ ..................................... C30B 35/00
[52] U.S. Cl. .................. 117/201; 117/14; 117/202
[58] Field of Search ..................... 117/13, 14, 15, 117/200, 201, 202

[56] References Cited

U.S. PATENT DOCUMENTS

| | | | |
|---|---|---|---|
| 3,740,563 | 6/1973 | Reichard | 117/15 |
| 4,710,258 | 12/1987 | Latka | 117/15 |
| 5,074,953 | 12/1991 | Shirata et al. | 117/14 |
| 5,138,179 | 8/1992 | Buba et al. | 117/15 |
| 5,170,061 | 12/1992 | Baba | 117/14 |
| 5,240,684 | 8/1993 | Baba et al. | 117/14 |
| 5,437,242 | 8/1995 | Hofstetter et al. | 117/14 |

FOREIGN PATENT DOCUMENTS 63-256594A 10/1988 Japan ..................... 117/14

*Primary Examiner*—Felisa Garrett
*Attorney, Agent, or Firm*—Varndell Legal Group

[57] ABSTRACT

An apparatus for precisely detecting the diameter of the single-crystal material which is fabricated by a continuously charged method is disclosed. Variables such as the crucible raising amount, the material charging amount and the weight of a growing single crystal can be detected by conventional detecting apparatus. A present melt surface position is obtained by initial melt surface position+the crucible raising amount +(material charging amount/crucible area)−(weight of the single-crystal/crucible area) and then provided to a diameter control apparatus. The sensing angle with respect to the initial melt surface position 3a is θ. The height from initial melt surface position 3a to one-dimensional image sensor 2 is h. The horizontal distance between the scanning line and the one-dimensional image sensor is r. When the melt surface falls by a distance of a Δh from position 3a to position 3b, the adjusted sensing angle θ' can be obtained from $\theta'=\cos^{-1}[(h+\Delta h)/\{(h+\Delta h)^2+r^2\}^{1/2}]$.

3 Claims, 3 Drawing Sheets

5,660,629

APPARATUS FOR DETECTING THE DIAMETER OF A SINGLE-CRYSTAL SILICON

BACKGROUND OF THE INVENTION

1. Field of the Invention

The present invention relates to the fabrication of a single-crystal silicon by a continuously charged method, and more specifically, to an apparatus for detecting the diameter of the single-crystal silicon.

2. Description of Prior Art

Single-crystal silicon is often utilized as the substrate material of semiconductor devices. The single-crystal silicon can be fabricated by the Czochralski (CZ) method in which a cylindrical single-crystal silicon rod is pulled up from melt material inside a crucible which is located inside a fabricating chamber of a single-crystal silicon fabrication apparatus. Polysilicon material is charged into the crucible. The polysilicon material is heated and melted by a main heater disposed around the crucible. A single-crystal seed, which is fixed on a seed holder, is immersed in the melt. When the seed holder rises from the melt and rotates in phase or out phase with the rotation direction of the crucible, the single-crystal silicon rod is formed on the seed. A continuously charged method, by which a sufficient amount of polysilicon material is continuously fed into the crucible, can be applied in accompaniment with the CZ method to efficiently produce large-diameter single-crystal silicon rods.

The diameters of the single-crystal semiconductor material should be controlled with acceptable ranges when it is fabricated by the CZ method. The methods for controlling the diameters include optical methods, methods by weighting the crystal, and so on. In the optical method, a real-time measurement of the diameter can be carried out by instruments such as an image sensor and ITV camera. That is, a line that transverses the meniscus ring formed on an interface between the single-crystal material and the melt, and that passes through the center of the meniscus ring or passes through a point which has a specific distance to the center of the meniscus ring, is adapted as a scanning line of the image sensor. Pixel positions of the image sensor, which correspond to these lines, are detected to determine a distance between the pixel positions, and then the diameter of the single-crystal silicon is determined.

The single-crystal diameter measurement by line scanning or by one-dimensional scanning using the CCD camera cannot detect the precise diameter value in case that the melt surface is floating up and down since the scanning line is fixed. For example, referring to FIG. 5, when the melt surface position shifts down from position 3a to 3b, the detected diameter value of the single-crystal silicon 1 by a scanning line P will change from L1 to L2. Especially when the continuously charged method is utilized to provide the melt in the crucible, the position of the melt surface depends mostly on varying factors such as the charging amount of the material, the growing rate of the single-crystal silicon and the raising speed of the crucible. The material charged into the crucible will raise the height of the melt surface. The growing single-crystal silicon consumes the melt, thus lowering the height of the melt surface. The height of the melt surface obviously depends on the position of the crucible. Therefore, these varying factors must be controlled and detected for calibration of the scanning line position or the sensing angle, or the precise diameter of the growing single-crystal material cannot be obtained. Moreover, in the continuously charged method, after the single crystal pulling process continues for a certain period, the supply of the polysilicon material is stopped. However, since the melt surface falls gradually during this period, the conventional optical sensor cannot correctly detect the diameter of the single-crystal material. Therefore, the diameter of the single-crystal silicon must be estimated, based on the experiences of the operator.

SUMMARY OF THE INVENTION

Accordingly, an object of the present invention is to provide an apparatus for detecting the diameter of the single-crystal silicon,which can precisely detect the diameter of the single-crystal material by taking the variation of the melt surface into consideration.

The apparatus for diameter detection of the present invention can be applied in a continuously charged single-crystal material fabricating process. The present invention is characterized in that a present melt surface position is calculated by an initial melt surface position and variables such as the crucible raising amount, the material charging amount and the weight of a growing single crystal. Since the variables determine the present melt surface position, the diameter of the growing single-crystal silicon can be correctly detected at the present melt surface position calculated by adjusting an scanning line position or a sensing angle of an optical diameter detector.

When the continuously charged method for single-crystal material fabrication is applied, the charging amount of polysilicon material in the crucible is a primary variable in the variation of melt surface position. Since the present invention calculates the present melt surface position by the charging amount of the polysilicon material, and automatically adjusts the scanning line position or the sensing angle of the optical diameter detector by the present melt position, the detector can detect an optimal position according to the variation of the melt surface height. Therefore, the diameter of the single-crystal silicon can be precisely detected by the apparatus of the present invention.

BRIEF DESCRIPTION OF THE DRAWINGS

Other objects, features, and advantages of the present invention will become apparent from the following detailed description of the preferred but non-limiting embodiment. The description is made with reference to the accompanying drawings, in which.

DETAILED DESCRIPTION OF THE INVENTION

Figure 1:
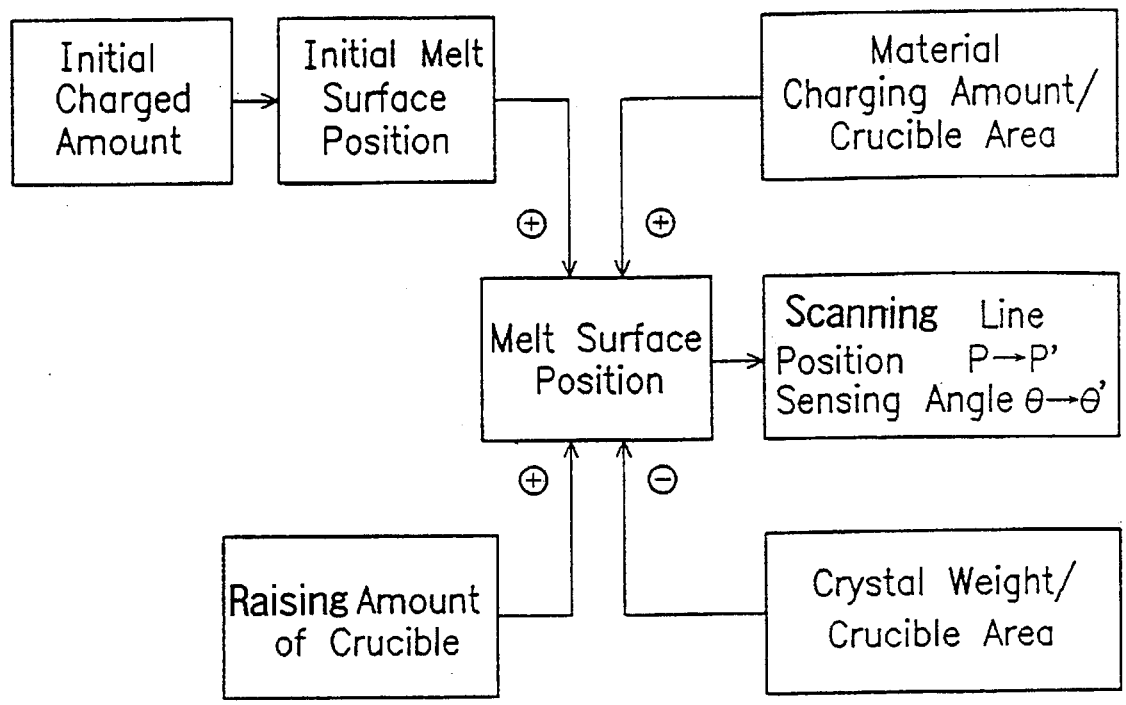
FIG. 1 is a block diagram illustrating the calculation of the melt surface position in a continuously charged single-crystal semiconductor fabrication process.

In the preferred embodiment of the present invention, the continuously charged method is utilized to fabricate the single-crystal semiconductor. The melt surface position can be calculated from the raising amount of the crucible, the charging amount of the material, and the weight of the single-crystal semiconductor. These values can be detected by detectors and then provided to the diameter detector. Referring to FIG. 1, in the diameter detector the present melt surface position can be obtained by adding the crucible raising amount and (material charged amount/area of the crucible) to an initial melt surface position determined by the initial material charged amount of the polysilicon materials, and then subtracting (weight of the single-crystal semiconductor/area of the crucible) therefrom. The present melt surface position is provided for calibrating the scanning line of the CCD camera from position P to P', or for calibrating the sensing angle of the one-dimensional line sensor from θ to θ'.

Figure 2:
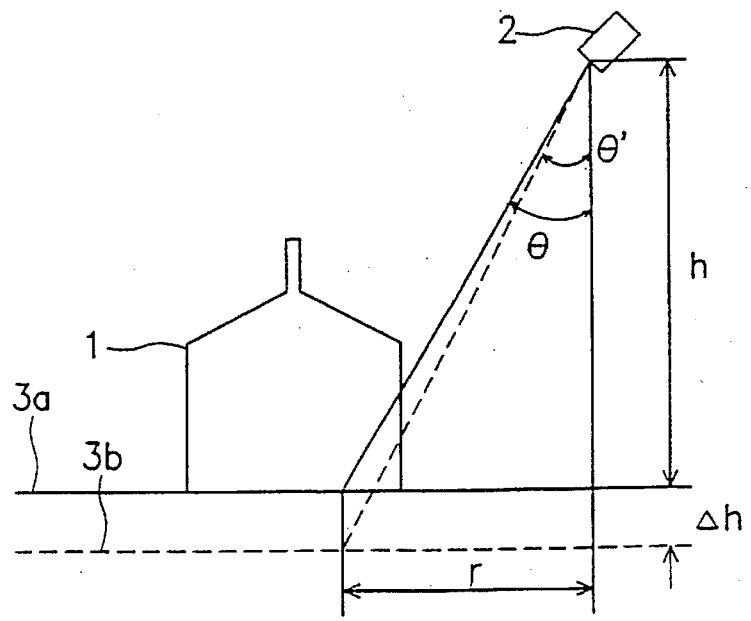
FIG. 2 is a schematic diagram illustrating the sensing angle of a one-dimensional image sensor.

FIG. 2 is a schematic diagram illustrating the sensing angle of a one-dimensional line sensor 2 and a growing single-crystal semiconductor 1. The sensing angle with respect to the initial melt surface position 3a is θ. The height from initial melt surface position 3a to one-dimensional image sensor 2 is h. The horizontal distance between the scanning line and the one-dimensional image sensor 2 is r. If the melt surface falls a distance of Δh from position 3a to position 3b, the adjusted sensing angle θ' can be obtained from the following equation:

$$\theta' = \cos^{-1}[(h+\Delta h)/\{(h+\Delta h)^2 + r^2\}^{1/2}]$$

Figure 3:
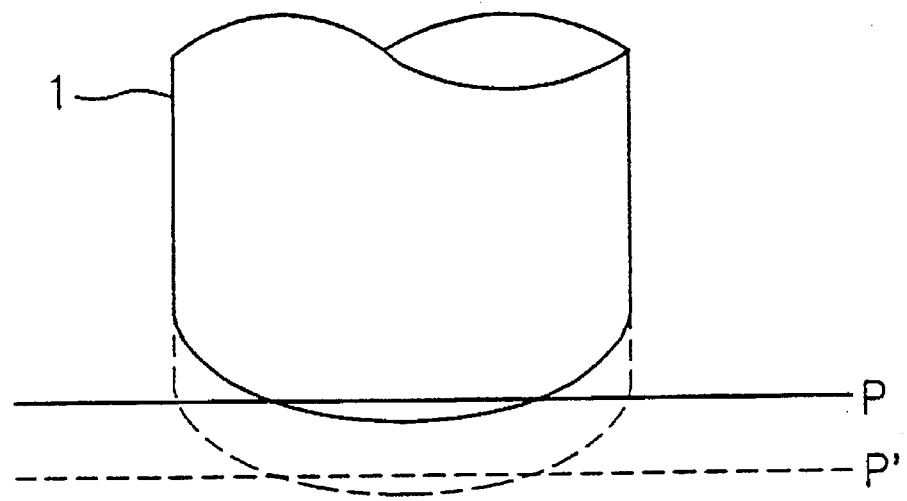
FIG. 3 is a schematic diagram illustrating a movement of the scanning line according to the adjustment of the sensing angle of a one-dimensional image sensor.
Figure 5:
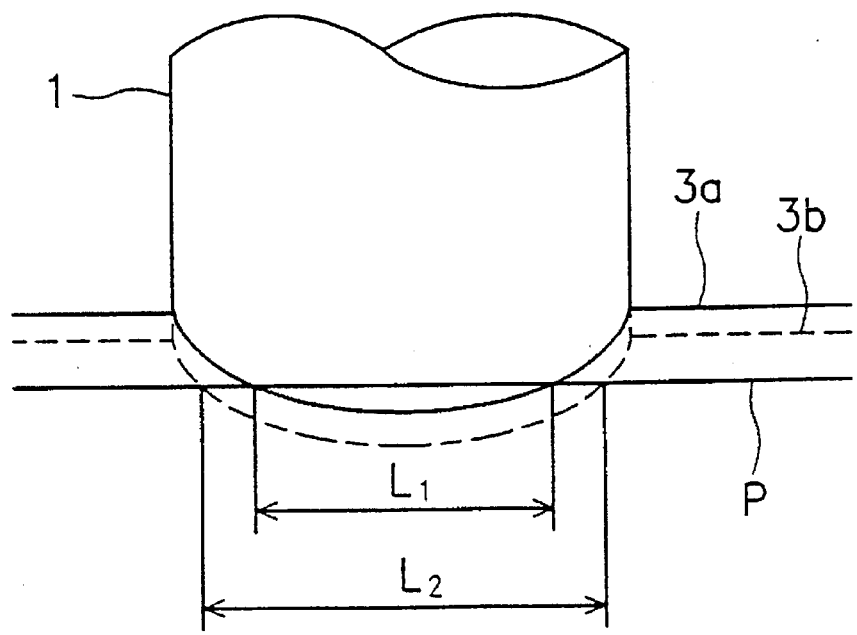
FIG. 5 is a schematic diagram illustrating the deviance of the melt surface position in a conventional single-crystal semiconductor diameter detector.

Referring to FIG. 3, adjustment of the scanning line position of the one-dimensional image sensor to detect a growing single-crystal 1 is illustrated. The sensing angle of the one-dimensional image sensor changes from θ to θ' when the melt surface falls by a distance of Δh. Therefore, the scanning line corresponding to the initial melt surface position will move from line P to line P'. Thus, the diameter of the growing single crystal material is correctly detected.

Figure 4:
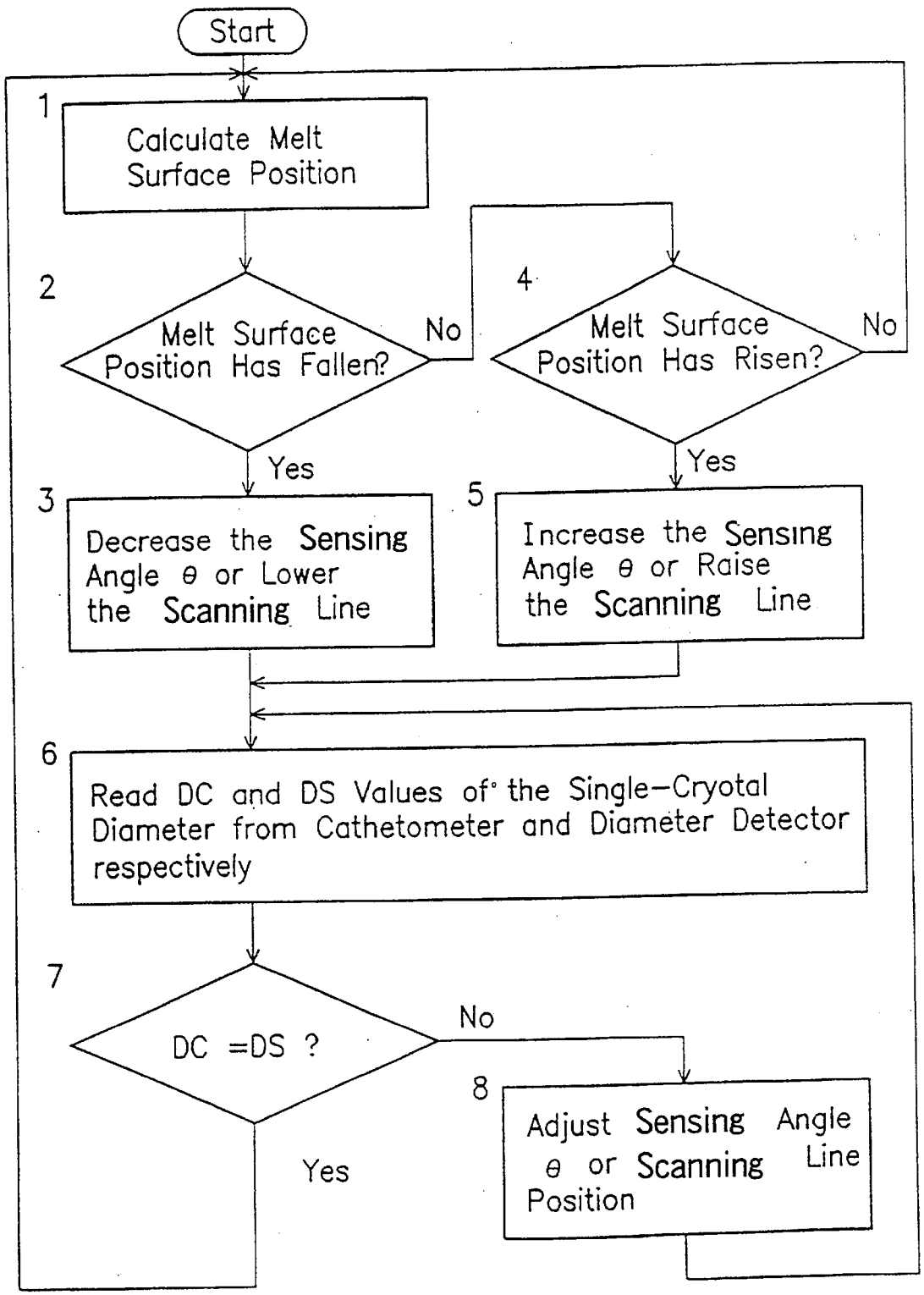
FIG. 4 is a flow chart illustrating the adjustment of the sensing angle in a one-dimensional image sensor or the scanning line position in a CCD camera.

A flow chart for showing the change of the sensing angle in the one-dimensional image sensor or the adjustment of the scanning line in the two-dimensional scanning CCD camera is depicted in FIG. 4. Referring to the figure, the numbers at the upper left of each block indicate the step order. In step 1, the present melt surface position is calculated by the method shown in FIG. 1. The present melt surface position is compared with the initial melt surface position in step 2 to see whether the melt surface has fallen or not. If the melt surface has fallen, in step 3, the sensing angle θ of the one-dimensional image sensor decreases or the scanning line of the one-dimensional scanning CCD camera falls. If the melt surface has not fallen, it is necessary to see if the melt surface has risen. The judgment whether the melt surface has risen is carried out in step 4. If the melt surface has not risen, the calculation of the present melt surface position in step 1 is repeated. If the melt surface has risen, in step 5, the sensing angle θ of the one-dimensional image sensor increases or the scanning line of the one-dimensional scanning CCD camera rises.

After step 3 or step 5, in step 6, two measured diameter values of the single-crystal material, i.e., value DC by a cathetometer and value DS by the image sensor or the CCD camera(diameter detector), are read. These diameter values are compared in step 7. If DS equals DC, the process reverts to step 1. If the two values are not equal, the sensing angle θ or the scanning line position must be adjusted in step 8 and step 6 is repeated.

As stated above, in the present invention, the melt surface position can be calculated from variables which determine the variation of the melt surface in the continuously charged method for fabricating the single-crystal material. The scanning line of the optical diameter detector can be adjusted by the calculated position value to correctly detect the diameter of the single crystal. Moreover, the conventional optical detector cannot properly control the pulling process of the single crystal material when the supply of the polysilicon material is stopped. This problem can be overcome and the diameter of the single-crystal material can be precisely detected by the method of the present invention.

What is claimed is:

1. An apparatus for detecting a diameter of a growing single-crystal silicon which is fabricated by a continuously charged method, said apparatus comprising:

a calculating means which calculates a present melt surface position based on an initial melt surface position and variables such as of raising amount, material charging amount and weight of said growing single crystal; and adjusting means for adjusting a scanning line and detecting angle of an optical diameter detector corresponding to the present melt surface.

2. An apparatus for detecting a diameter of a growing single-crystal silicon which is fabricated by a continuously charged method, said apparatus comprising:

a calculating means for calculating a present melt surface position based on variables including raising amount, material charging amount and weight of said growing single-crystal silicon;

an optical diameter detector for determining said diameter of said growing single-crystal silicon based on a scanning line and a detecting angle; and an adjusting means for adjusting said scanning line and said detecting angle of said optical diameter detector corresponding to said present melt surface position.

3. An apparatus for detecting a diameter of a growing single-crystal silicon which is fabricated by a continuously charged method, said apparatus comprising:

a calculating means for calculating a present melt surface position of said growing single-crystal silicon;

an optical diameter detector for determining said diameter of said growing single-crystal silicon at said present melt surface position based on a scanning line and a detecting angle; and an adjusting means for adjusting said scanning line and said detecting angle of said optical diameter detector corresponding to said present melt surface position.

\* \* \* \* \*

UNITED STATES PATENT AND TRADEMARK OFFICE
CERTIFICATE OF CORRECTION

PATENT NO.  : 5,660,629
DATED       : August 26, 1997
INVENTOR(S) : Yutaka Shiraishi It is certified that error appears in the above-identified patent and that said Letters Patent is hereby corrected as shown below:

On the title page, item [75], delete "; Yihao Chang, Kanata, Canada".

On the title page, item [73], change "Kamatsu" to --Komatsu--.

Signed and Sealed this

Twenty-second Day of September, 1998

Attest:

BRUCE LEHMAN

*Attesting Officer*   *Commissioner of Patents and Trademarks*